(12) United States Patent
Heisch

(10) Patent No.: US 7,545,488 B2
(45) Date of Patent: Jun. 9, 2009

(54) APPARATUS FOR IMPLEMENTING A LIGHT-EMITTING DIODE METER

(75) Inventor: Randall R. Heisch, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 11/558,495

(22) Filed: Nov. 10, 2006

(65) Prior Publication Data
US 2008/0111990 A1    May 15, 2008

(51) Int. Cl.
*G01J 1/00* (2006.01)
*G01J 1/34* (2006.01)

(52) U.S. Cl. .................. 356/213; 356/217; 356/229

(58) Field of Classification Search ............. 356/213, 356/217–219, 224, 226; 324/76.11, 76.79, 324/160, 175
See application file for complete search history.

(56) References Cited

U.S. PATENT DOCUMENTS

| | | | | |
|---|---|---|---|---|
| 4,218,140 A | * | 8/1980 | Biggs et al. | 356/226 |
| 5,748,302 A | * | 5/1998 | Unno | 356/224 |
| 6,005,659 A | * | 12/1999 | D'Alessandro et al. | 356/213 |
| 6,567,160 B1 | * | 5/2003 | Ishikawa et al. | 356/229 |
| 6,614,518 B1 | * | 9/2003 | Ishikawa et al. | 356/218 |

* cited by examiner

*Primary Examiner*—L. G Lauchman
(74) *Attorney, Agent, or Firm*—Dillon & Yudell, LLP

(57) ABSTRACT

An light-emitting diode (LED) meter capable of analog presentations is disclosed. The LED meter includes an LED and a reflective object. The reflective object is capable of reflecting light emitted from the LED. The reflective object is also capable of being moved to and for along a path. The LED meter also includes means for selectively enabling the LED to emit light continuously for a duration that is proportional to a magnitude of measurement.

7 Claims, 3 Drawing Sheets

US 7,545,488 B2

APPARATUS FOR IMPLEMENTING A LIGHT-EMITTING DIODE METER

BACKGROUND OF THE INVENTION

1. Technical Field

The present invention relates to display meters in general, and more particularly, to light-emitting diode meters. Still more particularly, the present invention relates to an apparatus for implementing a light-emitting diode meter.

2. Description of Related Art

Magnetic type meters are commonly used for indicating magnitudes of specific measurements such as speed, power, intensity, etc. A magnetic type meter typically includes a dial, a pointer and a drive unit for presenting a specific magnitude by rotating the pointer to an appropriate dial position. Because the moving parts of magnetic type meters are more prone to mechanical problems, some magnetic type meters have been replaced by light-emitting diode (LED) meters that have fewer moving parts.

LED meters can be designed to display magnitudes of measurements in an analog or digital manner. For a digital presentation of magnitudes, an LED meter is designed to display magnitudes in corresponding digital numerals. On the other hand, an analog presentation of magnitudes can be provided by utilizing an array of LEDs to mimic or emulate the display characteristics of magnetic type meters.

Although LED meters using digital presentations are more precise in their display of magnitudes, LED meters using analog presentations tend to be more aesthetically appealing to the analog human psyche. As such, most people prefer LED meters with analog presentations over LED meters with digital presentations. However, LED meters with analog presentations utilize more LEDs and often require more complicated control circuits and higher power consumption.

Consequently, it would be desirable to provide an improved method for implementing an LED meter with analog presentations in a cost effective and energy efficient manner.

SUMMARY OF THE INVENTION

In accordance with a preferred embodiment of the present invention, an light-emitting diode (LED) meter includes an LED and a reflective object. The reflective object is capable of reflecting light emitted from the LED. The reflective object is also capable of being moved to and fro along a path. The LED meter also includes means for selectively enabling the LED to emit light continuously for a duration that is proportional to a magnitude of measurement.

All features and advantages of the present invention will become apparent in the following detailed written description.

BRIEF DESCRIPTION OF THE DRAWINGS

The invention itself as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
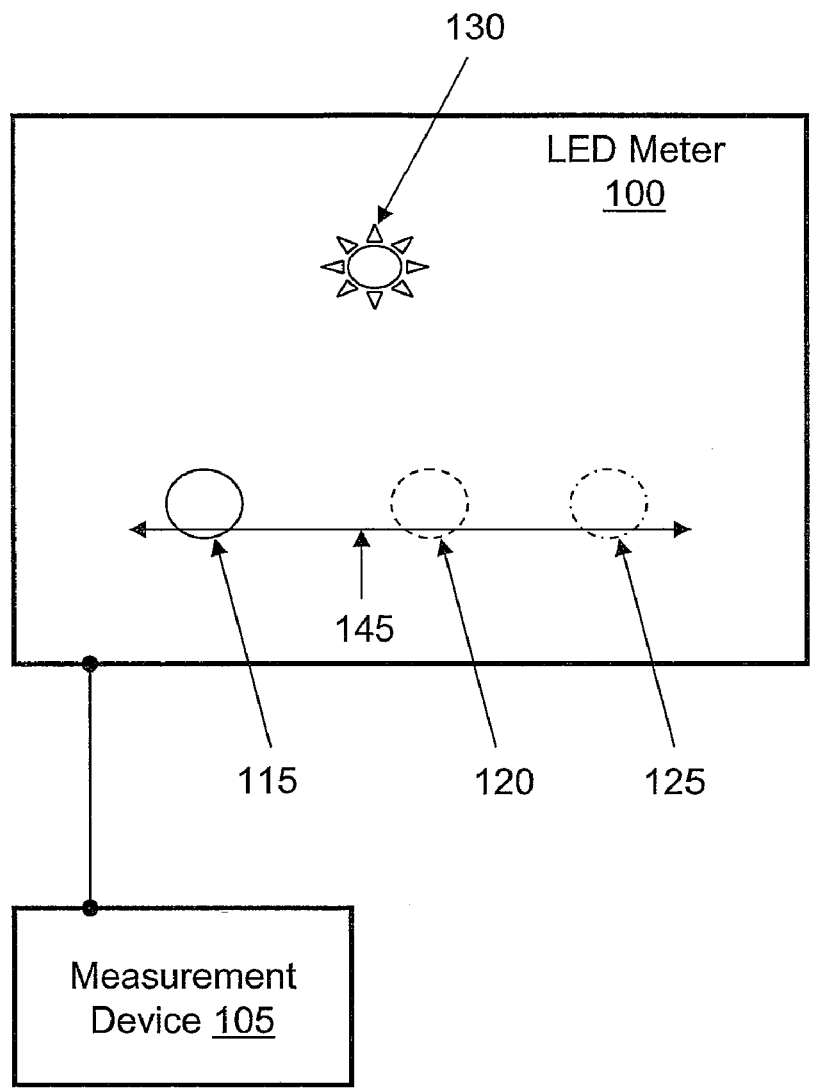
FIG. 1 is a diagram of a light-emitting diode (LED) meter, in accordance with a preferred embodiment of the present invention.

Referring now to the drawings, and specifically to FIG. 1, there is depicted a diagram of a light-emitting diode (LED) meter, in accordance with a preferred embodiment of the present invention. As shown, an LED meter 100, which is capable of display magnitude of measurements in an analog manner, includes an LED 130 and a reflective object 115. Reflective object 115 is preferably is a sphere but an object of other shapes may also be applicable. LED 130 can be a semiconductor LED or any other light source having a relatively fast impulse response time.

LED meter 100 can be connected to a measurement device 105 that is capable of generating a series of output signals that represent the corresponding magnitudes of measurements. Depending on the type of application for which measurement device 105 is designed, the magnitudes of measurements can be any commonly known performance characteristics such as speed, power, intensity, etc.

During operation, reflective object 115 is being moved to and fro along a path 145 in a repetitive manner while light is emitted from LED 130 in response to the output signals from measurement device 105. Path 145 can be linear, elliptical or circular. The duration of each light emission from LED 130 directly corresponds to the magnitudes of measurements formulated by measurement device 105. The light emitted from LED 130 is subsequently reflected by reflective object 115, and the resulting light reflections can be viewed by a user from multiple angles in front of LED meter 100.

Figure 2:
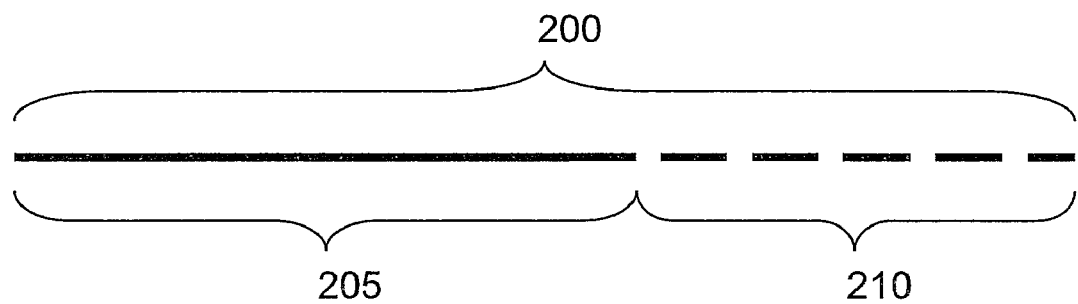
FIG. 2 is a diagram of an exemplary visual output of the LED meter from FIG. 1, in accordance with a preferred embodiment of the present invention.

With reference now to FIG. 2, there is a graphical depiction of an exemplary visual output of LED meter 100, in accordance with a preferred embodiment of the present invention. As shown, the exemplary visual output appears as a graphical line 200, which includes a solid line 205 and a set of dashed lines 210. Solid line 205 represents a measurement magnitude, and the set of dashed lines 210 fills out the remaining void of the entire length of path 145 (from FIG. 1).

Graphical line 200 is generated as follows. During each period of movement of reflective object 115 along path 145, LED 130 continuously emits light for a portion of each period corresponding to measurement magnitudes based on corresponding output signals from measurement device 105 to generate solid line 205, and then pulses light for the remaining portion of each period to generate dashed lines 210. For example, LED 130 may continuously emit light when reflective object 115 is moving from position 115 to position 120 (from FIG. 1) in order to generate solid line 205, and then LED 130 may pulse light when reflective object 115 is moving from position 120 to position 125 (from FIG. 1) in order to generate dashed lines 210. Due to the human persistence of vision of reflective object 115 along path 145, a viewer is able to see solid line 205 and dashed lines 210 as a result.

Figure 3:
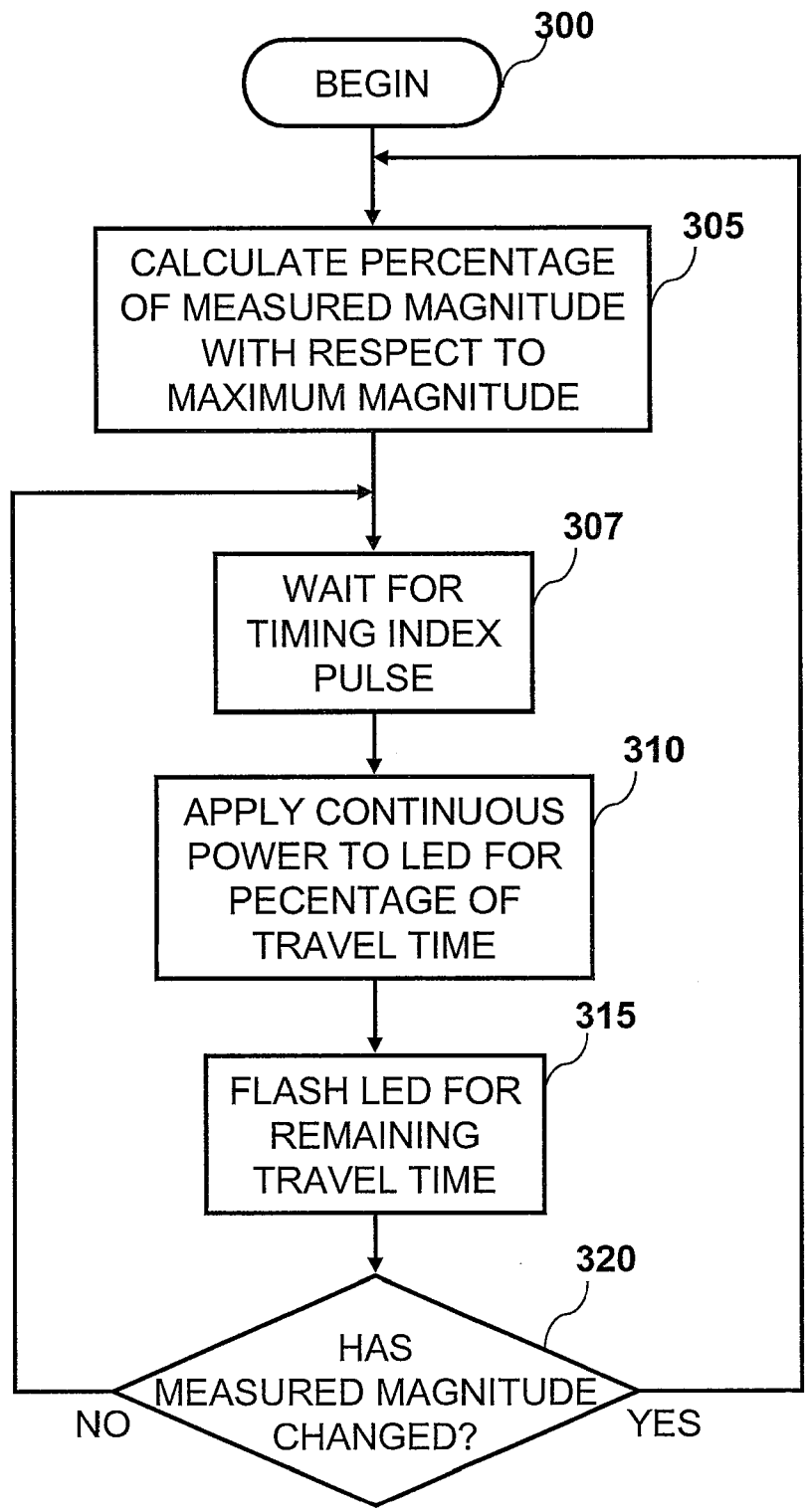
FIG. 3 is a high-level logical flow diagram of a method for controlling the LED meter from FIG. 1, in accordance with a preferred embodiment of the present invention.

Referring now to FIG. 3, there is depicted a high-level logical flow diagram of a method for utilizing LED meter 100 to present a measurement magnitude received from a measurement device, in accordance with a preferred embodiment of the present invention. Starting at block 300, in response to the receipt of a measured magnitude received from a measurement device, such as measurement device 105 from FIG. 1, the percentage of the measured magnitude with respective to the maximum magnitude of measurement is determined, as shown in block 305. Preferably, the entire length of path 145 from FIG. 2 represents the maximum magnitude of measurement. Reflective object 115 then waits for a timing index pulse before traveling down path 145, as depicted in block 307. The timing index pulse indicates the start of a periodic display process; for example, one round trip for a linear path, and one per revolution for a circular path. While reflective object 115 is traveling along path 145, continuous power is applied to LED 130 for the duration of the determined percentage of the time for reflective object 115 to travel the entire length of path 145, as depicted in block 310. As reflective object 115 continues to travel along path 145, the power to LED 130 is selectively interrupted in order to cause LED 130 to flash on and off for the remaining traveling time along path 145, as shown in block 315.

A determination is then made whether or not the measured magnitude received from the measurement device has been changed, as depicted in block 320. If the measured magnitude received from the measurement device has not been changed, the process returns to block 307. Otherwise, if the measured magnitude received from the measurement device has been changed, the process returns to block 305.

As has been described, the present invention provides an apparatus for implementing an LED meter with analog presentations. The present invention enables a single long-lasting and power-efficient LED to be utilized to display a variety of metrics without the use of complex display mechanisms or multiple light sources. Furthermore, a visible output can be viewed from multiple angles by utilizing at least one partially spherical reflector.

While the invention has been particularly shown and described with reference to a preferred embodiment, it will be understood by those skilled in the art that various changes in form and detail may be made therein without departing from the spirit and scope of the invention.

What is claimed is:

1. An light-emitting diode (LED) meter comprising:
    an LED;
    a reflective object capable of reflecting any light emitted from said LED, wherein said reflective object is also capable of being moved to and fro along a path; and
    means for selectively enabling said LED to emit light continuously for a duration that is proportional to a magnitude of measurement.

2. The LED meter of claim 1, wherein said reflective object is a sphere.

3. The LED meter of claim 1, wherein said path is linear.

4. The LED meter of claim 1, wherein said path is elliptical.

5. The LED meter of claim 1, wherein said path is circular.

6. The LED meter of claim 1, wherein said means for selectively enabling further includes means for selectively enabling said LED to emit light continuously as a percentage of time for said reflective object to travel along the entire length of said linear path.

7. The LED meter of claim 6, wherein means for selectively enabling further includes means for selectively enabling said LED to emit light intermittently during the remaining percentage of time for said reflective object to travel along the remaining length of said linear path.

* * * * *